United States Patent [19]

Etchells et al.

[11] Patent Number: 5,536,908
[45] Date of Patent: Jul. 16, 1996

[54] LEAD-FREE PRINTED CIRCUIT ASSEMBLY

[75] Inventors: Richard K. Etchells, Houston; Lawrence E. Tawyea, Webster, both of Tex.

[73] Assignee: Schlumberger Technology Corporation, Houston, Tex.

[21] Appl. No.: 534,370

[22] Filed: Sep. 27, 1995

Related U.S. Application Data

[63] Continuation of Ser. No. 352,969, Dec. 9, 1994, abandoned, which is a continuation of Ser. No. 948, Jan. 5, 1993.

[51] Int. Cl.$^6$ ........................................ H05K 1/11
[52] U.S. Cl. .................. 174/257; 174/262; 174/261; 174/250; 174/259
[58] Field of Search ........................ 124/255, 256, 124/257, 260, 262, 261, 266, 250, 259

[56] References Cited

U.S. PATENT DOCUMENTS

| | | | |
|---|---|---|---|
| 4,024,631 | 5/1977 | Castillero | 29/625 |
| 4,104,111 | 8/1978 | Mack | 156/656 |
| 4,572,925 | 2/1986 | Scarlett | 174/68.5 |
| 4,597,828 | 7/1986 | Tadros | 156/643 |
| 4,605,471 | 8/1986 | Mitchell | 156/645 |
| 4,632,484 | 12/1986 | Sinclair | 339/75 |
| 4,633,050 | 12/1986 | Samuels | 200/268 |
| 4,732,649 | 3/1988 | Larson et al. | 156/652 |
| 4,904,968 | 2/1990 | Theus | 333/246 |
| 4,963,701 | 10/1990 | Yasumoto et al. | 174/256 |
| 4,985,600 | 1/1991 | Heerman | 174/255 |
| 5,235,139 | 8/1993 | Bengston et al. | 174/257 |

Primary Examiner—Laura Thomas
Attorney, Agent, or Firm—Darcell Walker

[57] ABSTRACT

A printed circuit is provided that is capable of operating at temperatures above 200° C. A printed wiring board has a plating scheme of Tin plating over sulfamate nickel plated over copper. The materials are electroplated in the pattern of the desired circuit. The copper provides a conductive material for carrying electrical current. The sulfamate nickel is a ductile material that serves as a barrier between the copper and the Tin and is able to maintain its strength under temperatures of above 200° C. The Tin is compatible with the new solder compound that is used to solder electrical components to the board. The solder compound is comprised of Tin and Silver. This solder has a higher initial melting point than traditional Tin/Lead solders but has a lower solder reflow temperature than conventional HMP solder compounds. This new solder is also stronger than conventional HMP solder and contains virtually no Lead component. A multilayer printed circuit is also provided that has a "Pads Only" design in which only the pads and short runs connecting to vias are allowed on the outer layers of the board. All power and signal runs are restricted to the inner layers of the board. This design has the advantage of protecting the runs in a high temperature environment and results in a more reliable assembly. The multilayer circuit uses the same plating scheme as in the above-described printed circuit.

25 Claims, 3 Drawing Sheets

LEAD-FREE PRINTED CIRCUIT ASSEMBLY

This is a continuation of application Ser. No. 08/352,969, filed Dec. 9, 1994, which is a continuation of 08/000,948, filed on Jan. 5, 1993, now abandoned.

FIELD OF THE INVENTION

This invention relates to a printed circuit capable of generating in a high temperature environment and a method for manufacturing printed circuits for use in high temperature applications.

BACKGROUND OF THE INVENTION

Today, printed circuits are one of the most widely used means of interconnecting electronic components. These circuits are used in virtually every industry that requires the use of electronic components. The wide-spread acceptance of these circuits has led to their use in an expanded range of applications. However, this expanded use has placed greater demands on the physical properties of the circuits. These increased demands have also caused several problems related to the use of printed circuits. Some of these problems, such as the complexity of the required circuit interconnections, the increased demands for circuit miniaturization (decreasing the circuit size), increased circuit densities (more components in the circuit space) and solder compatibility problems associated with mass-production soldering equipment have been addressed by a series of improvements in printed circuit manufacturing processes. These improvements have led to printed circuits with higher densities and greater reliability. However, some demands placed on the circuits, such as use of circuits in high temperature environments, the weight of printed circuits and the use of Lead components in these circuits have created other problems that have not been adequately addressed.

First, the use of these printed circuits has expanded to high temperature (greater than 130° C.) applications. Typically, maximum temperatures for current applications using printed circuits do not exceed 130° C. Exposure to higher temperatures can affect the physical properties of the circuits, especially the solder, and sometimes the operating capability of the electrical components.

The need for printed circuits with increased reliability during operations in high temperature environments is becoming more important especially in the automotive industry and energy industry applications. For example, in oil and gas exploration, printed circuits are housed in logging tools that are lowered into boreholes drilled in the earth's subsurface. Most printed circuit boards can affectively operate at maximum temperatures of approximately 130° C. However, the temperatures at certain borehole depths may reach 185° C. Therefore, if logging tools contain printed circuits, these circuits must be capable of reliably performing during exposure to these high temperatures. Also, in motor vehicles, printed circuits are used in instruments that monitor engine equipment and are located in environments that also reach temperatures above 150° C.

A second problem related to the exposure of printed circuits to high temperatures is the effect of solders with high melting point temperatures on the electronic components during the printed circuit manufacturing process. During the manufacturing process of printed circuits, electronic components are attached to a printed wiring board to create the printed circuit. Solder is used to attach the electronic components to the printed wiring board. In the soldering process, solder is melted to its reflow temperature. This is the temperature at which the solder readily bonds with the wiring board to which it attaches an electronic component. During the melting process, solder changes from a solid to a pasty state and then to a liquid. A better solder joint is created when the solder is in a completely liquid state. If the solder is not heated to the reflow temperature, the solder joint would be created with a pasty solder. This form of solder does not have the best bond and could lead to a broken solder joint. The solder reflow temperature is generally 30° C. to 40° C. above the initial melting point temperature of the solder and 80° C. above the application temperature. High temperature applications require solders with melting point temperatures much higher than the current application temperatures, therefore during the manufacturing process, electronic components will be exposed to very high solder reflow temperatures. This exposure and contact with the melted solder at these extremely high temperatures can weaken and damage the electronic components and even the printed circuit board. This weakening of components effectively shortens their life and decreases circuit reliability.

Another problem that affects the use of printed circuits is the physical weight of the circuits. The weight of the equipment is a major concern in the aerospace industry. This concern applies to all portions of the equipment including printed circuits. Therefore, there is a need to reduce the weight of the equipment including the printed circuits without reducing the equipment reliability or quality.

Still another problem with printed circuits is the amount of Lead contained in the solder that is used in the printed circuits. Because of environmental concerns and the increasing number of government regulations limiting the use of Lead, the future use of Lead materials in electronic components is uncertain. Therefore, there is a desire to produce printed circuits with reduced amounts of Lead.

As indicated earlier, the major factor that affects the use of printed circuits in high temperature environments is the solder used in these printed circuits. As the temperature of an environment rises, the melting point of the solder in the printed circuit is of more concern. The initial melting point of the solder is the temperature at which the solder begins to change from a solid to a liquid. If applications reach the initial melting point temperature of the solder, the strength of the solder and solder joint would weaken and thereby lead to circuit failure. One solution is to have solder materials with higher melting point temperatures. However, as the initial melting point of solder increases, the reflow temperature of the solder used in manufacturing the circuit also increases. The increase in the reflow temperature can damage electronic components during the manufacturing process.

The possibility of component damage is especially true for printed circuits with active surface mount devices. Because of the high lead counts of some surface mount devices and the fact that surface mount device leads do not extend through the printed wiring board, during the normal manufacturing process for circuits with surface mount devices, a "Mass Reflow" type of solder process is required to reliably attach the surface mount devices to the printed circuit board. In a Mass Reflow solder process, the entire board assembly, including electronic components, is exposed to the reflow temperature of the solder being used. The reflow temperature of the solder is high enough to melt the solder and attach an electrical component to the circuit board. However, the temperature is also low enough that the electronic components are not damaged from exposure to the heat. This reflow process is adequate for manufacturing printed circuits used in current temperature environments but, high temperature applications would require manufacturing printed circuits at reflow temperatures much higher than those presently used. Exposure of the components to these reflow temperatures, which are much higher than the application temperatures, could lead to component damage and failure.

Currently some high temperature applications use throughhole electronic components mounted on printed circuit boards. However, during the manufacturing process, these components are wave-soldered to the printed circuit boards. During wave-soldering, the bottom of the printed circuit board comes in contact with a stream of solder. This solder is usually Multicore HMP solder with a very high melting point temperature of approximately 330° C. However, since only the component pins on the bottom of the board are exposed to the high temperature solder, the electrical components are protected from the heat and no real damage is done to the board or components. However, for mixed technology printed circuit boards having both active surface mount and through hole devices, this wave soldering process would not be sufficient to adequately attach the surface mount components to the board. Therefore, another process is needed for manufacturing mixed technology circuits for use in high temperature environments.

Another factor that impacts the operation and manufacturing of printed circuits, is the percentage of Lead in the solder material. Current estimates indicate that Lead is included in approximately 99 percent of all printed circuits. In addition, because pure Lead has a high melting point, the general practice is to increase the amount of Lead in the solder of the circuits as the temperature of the circuit applications increase. As stated earlier, Lead is not a desired material to be included in these circuits. There are several reasons to use non-Lead components in printed circuits. It is known that combining Lead with other materials can result in solder compounds with lower than desired melting point temperatures. These lower melting point solders are not desirable in high temperature applications. In addition, Lead is a heavy material that adds weight to the solder and to the printed circuit. There is also growing support for government regulations to prohibit the use of Lead in electronic components. These reasons encourage a movement away from use of Lead component materials in printed circuits.

Because most applications of printed circuits are in environments where the maximum temperatures are approximately 130° C., concerns about solder melting points and solder reflow temperatures for high temperature environment applications are not a major concern. Furthermore, printed circuits that currently operate at temperatures above 130° C. use large amounts of Lead in their solder. In addition, these circuits do not contain active surface mount devices. Therefore, the printed circuits that are currently manufactured and used are not reliable in or desirable for high temperature applications.

For printed circuits to operate in high temperature environments, in particular those printed circuits that contain active surface mount devices, the circuits should have a solder that has a high enough melting point to maintain its mechanical properties in the high temperature application environments. However, this solder should have a low enough reflow temperature so that exposure of the active surface mount devices to the reflow temperatures during the manufacturing process do not harm the circuit devices or the printed circuit board. In addition, the solder should have minimal Lead content. Consequently, further improvements are needed especially in the solder used in these printed circuits to enable the circuits to perform in a reliable manner in high temperature environments.

SUMMARY OF THE INVENTION

It is an object of this invention to provide a new method of manufacturing printed circuits that can satisfactorily operate in temperature environments of at least 200° C.

It is another object of this invention to provide a method for manufacturing a lighter weight printed circuit.

It is another object of this invention to provide a printed circuit with a reduced Lead content.

It is still another object of this invention to provide a new plating scheme for the printed wiring board runs and pads.

It is still another object of this invention to provide a new method for manufacturing a printed circuit having higher reliability than current printed circuits.

Knowing the melting point of the solder is vital to determining the maximum temperature at which the solder can be exposed without losing its mechanical properties and consequently the maximum temperature at which the circuit can reliably operate. Another property of the solder that is important during the printed circuit manufacturing process is the reflow temperature of the solder. The reflow temperature is the temperature of the solder when it actually attaches the components to the board. It can be referred to as the temperature of solder when it is completely liquid. These reflow temperatures are much higher than the application temperatures and the exposure of the electronic components to these temperatures can damage and weaken the components, and thereby shorten the component life.

The present invention provides a printed circuit and method of assembling a printed circuit such that the circuit can continuously and reliably operate at temperatures of at least 200° C. The printed circuit has a solder with a melting point temperature, approximately 220° C., that is high enough to allow the circuit to be exposed to a high temperature environment of approximately 200° C. without causing the solder to melt and thereby causing the circuit to weaken and fail. Because of its special composition, the solder in the present invention also has a reflow temperature, approximately 250° C., that is low enough to allow the manufacturing of printed circuits without exposing the electronic components to the extremely high temperatures associated with reflow processes containing solders that have high melting point temperatures. The solder in this invention also has a minimal Lead content which make the circuits lighter and more desirable.

In addition to having a solder material with suitable melting point and reflow temperature properties, the electrical current conducting material in the circuit which carries electricity to the various circuit components should closely match the solder material. Matching the solder and current conducting material provides a better solder joint. This match is accomplished by using an appropriate plating scheme for the current conducting material. This plating scheme is the combination of the electrically conductive materials that are plated to the wiring board and the sequence of this plating process. The solder and plating scheme work together to provide a highly reliable system for building printed circuit boards with active surface mount devices for continuous operations of approximately 200° C.

In a method of the present invention, a printed wiring board is manufactured from a polyimide-glass substrate. The substrate is drilled to the hole pattern for a desired electrical circuit, then coated with an electrically conductive material. A plating resistant material is applied onto the substrate over the conductive material in a negative image pattern of the desired circuit pattern. A second conductive material usually copper is electroplated to the substrate in the areas not covered by the plating resistant. The next step is to plate a third conductive material over the second conductive material in the same pattern as the second conductive material. The third conductive material should be a ductile material and should be able to maintain its strength at temperatures over 200° C. A fourth conductive material is plated over the third conductive material. This conductive material must be compatible with the solder used to attach electrical components to the board and must be able to preserve the solderability of the third conductive material. The next step is to strip the plating resistant material from the substrate followed by the etching away of all of the first conductive material that coats the substrate. A solder mask covers the substrate surface except in areas where the soldering of electrical components to the substrate will occur. Printed circuits are manufactured by soldering electrical components to the printed wiring board with a low-Lead component solder. This solder has a melting point temperature of approximately 220° C. that can withstand high temperature environments, but also has a low enough reflow temperature, of approximately 250° C., so that exposure of electrical components to the temperature does not harm the circuit components or the printed circuit board.

A multilayer printed circuit is also provided that has a "Pads Only" design in which only the pads and short runs connecting to vias are allowed on the outer layers of the board. All power and signal runs are restricted to the inner layers of the board. This design has the advantage of protecting the runs in a high temperature environment and results in a more reliable assembly. The multilayer circuit uses the same plating scheme as in the above-described printed circuit.

DESCRIPTION OF THE PREFERRED EMBODIMENT

Prior to manufacturing printed circuits that can reliably perform in high temperature environments, careful consideration should be given to the melting point and reflow properties of the solder used in the manufacturing process. In general, the initial melting point temperature of solder is usually 50° C. higher than the application temperature. Current solder having low melting points in the range of 160° C. to 185° C. should not be used in circuits that are used in high temperature applications because the exposure to the high temperature environment could melt the solder and lead to circuit failures. However, a solder having a very high melting point (approximately 290° C.) would require an even higher reflow temperature (approximately 330° C.) that could damage the circuit board and electrical components when they are exposed to the extreme reflow temperatures during the manufacturing process. Therefore, the successful use of printed circuits in high temperature environments, especially those circuits containing active surface mount devices, requires the use of solder material with an initial melting point that is higher than the temperature of the application, but low enough that the printed circuit board and electronic components are not damaged during the manufacturing process by exposure to the extreme reflow temperatures of the solder.

Figure 1:
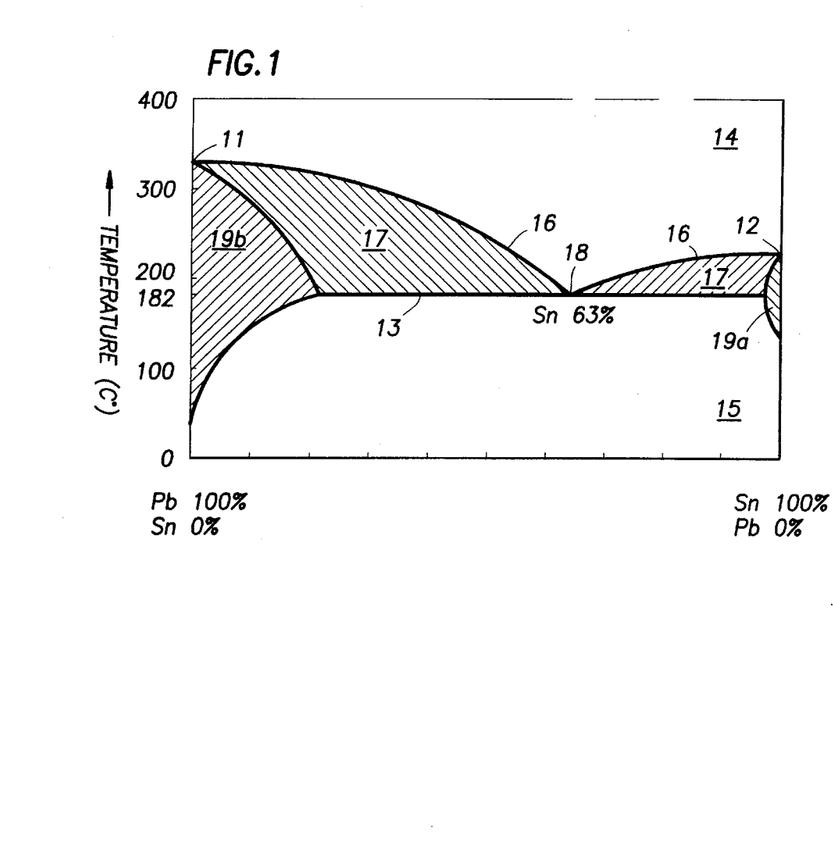
FIG. 1 phase diagram of solder compounds containing varying amounts of Lead and Tin.

In determining the composition of the solder to be used, reference is made to FIG. 1, which is discussed in detail in "Solders and Soldering" by Howard H. Manko, published in 1964 and 1979, by McGraw-Hill Book Company, most solders contain a combination of Lead and Tin. FIG. 1 illustrates the relationship between the initial melting point, reflow and eutectic temperatures for solder having Tin/Lead combinations. The reflow temperature 11 of pure Lead is approximately 330° C. Pure Tin has a reflow temperature 12 of approximately 230° C. However, when the Lead and Tin are combined in various percentages the melting points of the resulting solders will vary, depending on the percent of each element in the solder. However, the initial melting point 13 for most Lead/Tin solder compounds is roughly 182° C. In addition to the melting point, some solder combinations have a eutectic temperature. The eutectic temperature 18 is the temperature at which solder changes directly from a solid form to a liquid form or vice versa without going through any transition state 17. This temperature is considered to be both the initial melting point and the reflow temperature for the solder. During a solder transformation process, solder changes from a solid to a pasty state and then to a liquid. At the eutectic temperature, there is no pasty state of the solder. As shown in FIG. 1, one solder combination has a eutectic temperature of 182° C.

The liquid state of the solder is indicated by 14. The solid state of the solder is indicated by 15. As shown in FIG. 1, except for combinations containing approximately eighty percent or more of Lead, the initial melting point 13 is approximately 182° C. The liquidus (reflow) temperatures for all combinations vary and are shown by 16. The transition states of the solder is shown by 17. As the percent of the Tin in the solder increases, the reflow temperature approaches the initial melting point temperature, until the reflow and initial melting point temperatures meet at 18. This temperature is the eutectic temperature and is shown to be approximately 182° C. As seen, the percentages of Lead and Tin of the solder with a eutectic temperature is 63 percent Lead and 37 percent Tin.

Also shown in FIG. 1 is a Tin solid solution range 19a which also is eutectic. In this range, for solder with a Tin component that is approximately between 96 percent to 100 percent, the Tin component will remain completely solid, even after the temperature has exceeded the normal melting point for the solder. Also shown is 19b which defines the Lead solid solution range. In this range, for solder with a Lead component that is between 81 percent and 100 percent, the Lead component will remain completely solid. In this invention, the Tin solid solution range 19a is the important range. By having a solder that is approximately 96 percent Tin, printed circuits can operate in higher temperature environments without concern about the heat affecting the mechanical properties of the solder. Therefore for some combinations containing mainly Tin, the eutectic temperature can be as high as 220° C.

Since the solder material containing mainly Tin would have a eutectic temperature of approximately 220° C., the solder could retain its solid form under applications over 200° C. The solder would also have a low enough reflow temperature that the exposure to the high temperature applications would not damage the electrical components during the manufacturing process. Therefore, solder comprised of Tin and an extremely small amount of Lead would satisfy the requirements for a solder to be used in printed circuits that are used in high temperature environments.

Figure 2:
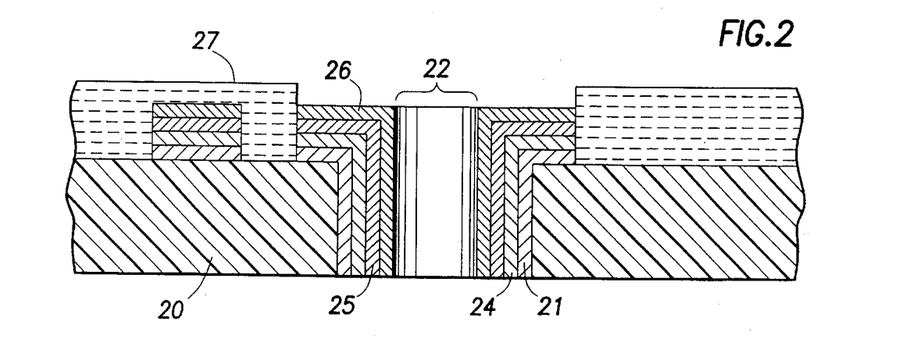
FIG. 2 shows the cross-sectional view of the printed wiring board in accordance with present invention.

FIG. 2 shows the preferred embodiment of the printed wiring board of the present invention. The printed wiring board has a polyimide-glass substrate 20 that serves as the base material for the board (referred to hereafter as the substrate). This substrate is made of a core material that is fiberglass-reinforced polyimide with 1 oz copper foil on both sides. The substrate must have an adequate surface area and thickness and must have electrical properties that can accommodate the desired electrical circuit. A typical substrate is a copper-clad lamina of fiberglass-reinforced epoxy having a thickness of 1.6 mm. The board contains holes 22 drilled in a previously designed circuit pattern. The substrate's surface is coated with two layers of copper 21 and 24. A first thin layer 21 lines the walls of the holes and establishes electrical communication between the two surfaces of the substrate. The second layer of copper 24 serves as the current carrying medium for the circuit board and covers the first layer in the pattern of the desired electrical circuit. This layer of copper has a thickness of 0.0015 to 0.0030 inches measured at a hole wall. A layer of low stress sulfamate nickel 25 overlays the copper in the same pattern as the second layer of copper. Sulfate nickel can also be used as this layer. Sulfamate nickel is ideal for this layer because it is ductile (not brittal as are other nickel compounds) also, it is stronger than copper and adds strength to the board. In addition, sulfamate nickel maintains its strength over a wide range of temperatures. The temperatures usually range from between −55° C. and 200° C. Sulfamate nickel is also highly solderable and it is inert to most chemical attacks, which is important to prevent oxidation and corrosion of the conductive materials. A layer of Tin 26 coats the layer of sulfamate nickel in the same pattern as the sulfamate nickel. The sulfamate nickel serves as a barrier to prevent the copper from contacting the Tin. This barrier is necessary because copper and Tin are very reactive at high temperatures. If the Tin reacted with the copper, the copper could be destroyed and therefore destroy the circuit. This third conductive material must also be able to preserve the solderability of the sulfamate nickel and be compatible with the solder used to assemble the board. A solder mask 27 covers the board except in the areas where solder will be applied. This mask will prevent most solder bridging which could occur.

In a second embodiment of the invention, a printed circuit is constructed by connecting electrical components to the printed circuit board manufactured in the previous embodiment of the invention. These components are connected to the board by the solder process using SN 96 solder. This solder is 96.5 percent Tin and 3.5 percent Silver. A benefit of this solder is that it is eutectic and has a melting point of 221° C. which is lower than that of current types of high-Lead solder. Therefore the reflow temperature of the solder can be lowered approximately some 80° C. (from approximately 330° C. to 250° C.) from that of conventional HMP solder. SN 96 solder melts at approximately 221° C. and reflows at approximately 250° C. Conventional HMP solder melts at approximately 300° C. and reflows at 330° C. In addition, conventional HMP solder has Lead as its main component, whereas the SN 96 solder is virtually Lead free. SN 96 is a stronger solder than conventional HMP solder and it is believed that its melting point is far enough above the high temperatures that the boards are not a concern during the operations in high temperature environments.

SN 96 solder does have a drawback in that it can become contaminated with relatively small amounts of Lead (1–1.5 percent), which results in a non-eutectic solder having a lower initial melting point close to that of standard SN 63 (183° C.). However, this problem is addressed by the non-Lead component plating scheme previously described. By having the non-Lead component plating scheme described earlier, Lead can not contaminate the solder during the soldering process.

Figure 3:
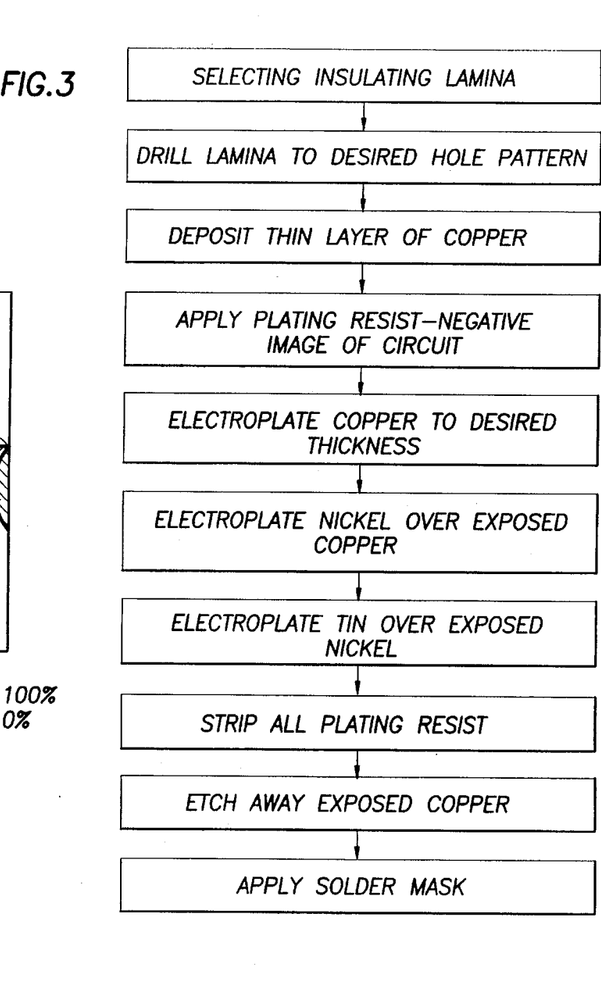
FIG. 3 is a flowchart of the steps performed during the manufacturing process of the printed wiring board.

Another embodiment of this invention is a method of manufacturing a printed circuit that can operate at temperatures approximately between −55° C. and 200° C. FIG. 3 shows a flow diagram of this process and FIG. 4 shows various stages of the printed wiring board during its production. Printed circuits and printed wiring boards are usually built by board manufactures. Companies that desire to have a board built usually take the manufacture a specification which has the requirements for building the board. These specifications can include the process steps for building the board. However, specific techniques used by the manufacturer may not be known to the entity desiring the board. In the present invention, the process steps and the specification were given to a manufacturer (Speedy Circuits of Huntington Beach, Calif.) to build a board following the steps of this process. This application describes the steps in the process, however, the particular techniques for accomplishing these steps may vary between manufactures. In addition, some of the particular materials and their compositions and manufacturing procedures used by a manufacturer are confidential to the manufacturer and are not known to the inventor. However those skilled in the art will understand how to perform each step in the described invention without additional information.

Referring to FIG. 3, the first step in this process is to select an insulating lamina material as the substrate of the wiring board. This laminate is usually a copper clad material of dielectric properties, with a sufficient area to contain the circuit, a suitable thickness, and suitable electrical properties as required in accordance with standard principles for substrate material selection. Typically, the choice is a copper-clad laminate of fiberglass with reinforced epoxy having a thickness of 1.6 mm with copper being on both sides of the substrate.

In experiments, the substrate was made of a core material of fiberglass-reinforced polyimide that is composite clad on both sides with 1 oz. copper foil. A preimpregnated bonding material glass-reinforced polyimide is bonded to the core material forming the laminate substrate. The materials forming the substrate should be manufactured by the same supplier.

Referring to FIG. 4, the substrate 20 is drilled to a desired hole pattern for a desired electrical circuit. The holes 22 are drilled in the areas where conductive material will be plated to the substrate. This drilling will result in the proper number of holes and the location and size of the holes in the exact configuration of the desired hole pattern for the circuit. A layout of the circuit and hole and pad pattern is done in advance to the exact spacings and dimensions to fit within the area of the substrate. This drilling step and the other steps up to this point are all well known to those experienced in the art.

Figure 4A:
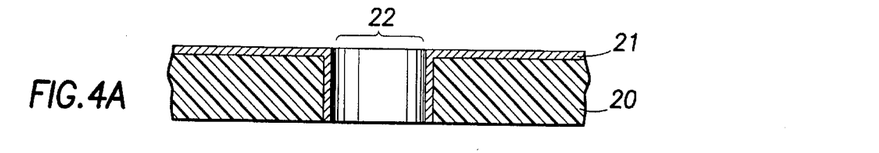
FIG. 4(a) though 4(h) shows the cross-sectional view at various stages of the manufacturing process for the present invention.

After the holes are drilled in the substrate, the substrate is coated with a thin layer of electroless copper, FIG. 4A. This layer of copper 21 covers both surfaces of the substrate and also coats the walls of the holes drilled in the substrate to establish electrical communication between both sides of the substrate. This layer of copper should be sufficient for subsequent electrodeposition of other conductive materials. The coating can occur by submerging the substrate in a copper bath of an aqueous solution containing sodium hydroxide, which chemically deposits a layer of copper over the entire surface of the laminate substrate and the walls of the drilled holes. The specific gravity and ph factor of the copper bath may vary between manufactures and is usually determined by the manufacturer performing this method.

Figure 4B:
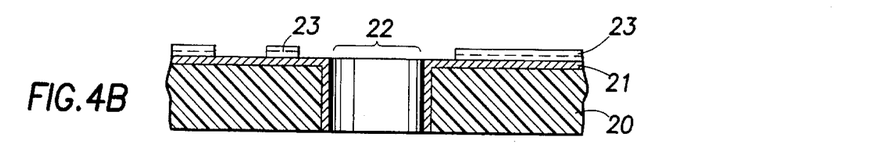

Over the thin coating of copper, a plating resist material 23 is applied to the substrate using a photographic process. This is illustrated in FIG. 4B. The laminate substrate is placed in a silk-screening fixture having a silk-screen containing an actual size positive image of the desired circuit pattern. This silk-screen covers the areas of the laminate substrate that is the actual design of the circuit. The silk-screen is sensitive to ultra-violet light, which is flashed onto the silk-screen. The silk-screen reacts with the ultra-violet light thereby depositing a plating resist onto the substrate. Using the silk-screen, a uniform layer of organic plating resist is applied over the copper layer in the areas on which there is no circuit pattern. This plating resist can be a modified vinyl intended for silk-screen printing which is chemically strippable without damage to the underlying copper. Since the plating resist is applied only to those areas under the silk-screen where the silk-screen image is absent, a negative image pattern of plating resist will result, with the circuit pattern being exposed to the plating process.

Figure 4C:
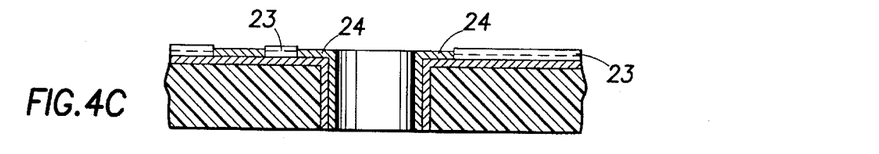

FIG. 4C shows a thicker layer of copper 24 is next electroplated onto the surface of the substrate laminate in the desired circuit pattern and at a desired thickness based on the current requirements for the desired circuit. During this electroplating process, electrolytic copper is deposited from a pyrophoshate or sulfuric acid/copper sulfate plating bath. Electrical leads are attached to the laminate substrate and an electrical current is applied to the substrate thereby plating the copper to the substrate in the areas not covered by the plating resist material. This layer of copper typically has a thickness of between 0.0015 and 0.0030 inches measured at the hole wall. The minimum elongation of the copper should be 12 percent and the purity should be 99.5 percent. There are other materials with the same conductive properties as copper that can be used for this layer such as gold, tungstun and platinum. However, because this invention describes a substractive process that uses a glass-plastic substrate, copper is preferred for this invention. The thicker layer of copper covers the laminate substrate in all areas except where plating resist exist. It should be noted that other methods, in particular U.S. Pat. No. 4,104,111 Mack, apply another plating mask at this point. This is done to avoid bridging during the soldering process. Applying a conformally coated mask alleviates this problem. However, this second plating mask is not necessary in the present invention because the present invention uses pattern plating, where everything except the circuit pattern is plated. A second plating mask is necessary when selective plating is used. In selective plating, used in Mack, only the areas where solder is desired will be plated.

Figure 4D:
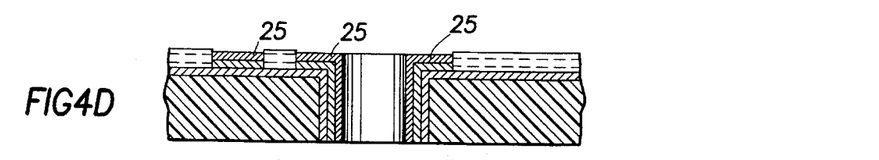

After the laminate substrate is removed from the copper plating bath and cleaned, the substrate is reconnected to an electrode and placed in a pure sulfamate nickel bath. Low stress sulfamate nickel 25 from an all sulfamate or all sulfate bath is electroplated over the copper layer in the same pattern as the copper as is shown in FIG. 4D. Thickness of this sulfamate nickel layer is approximately 0.00045± 0.00025 inches. The sulfamate nickel was chosen because it will provide a barrier between a third conductive material and the copper in the desired circuit. Also, the sulfamate nickel imparts strength to the plated through holes. It is necessary that this material be able to maintain its strength over a wide range of temperatures (approximately −55° C. to 200° C.). The sulfamate nickel was also chosen because of its ductile character (most nickel compounds are brittal), it is highly solderable and because it is inert to most chemical attacks which mainly prevents oxidation and corrosion of metals. There are other materials with the same properties as sulfamate nickel that can be used for this layer such as iron and platinum.

Figure 4E:
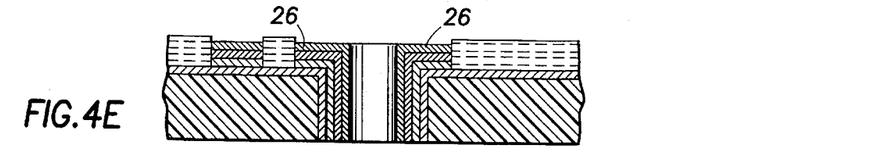

At this stage of the process FIG. 4E, the areas plated by sulfamate nickel are plated with 100 percent Tin 26 in the same manner as the copper and the sulfamate nickel. The Tin coating is applied by electroplating the Tin over the sulfamate nickel plating. The thickness should be 0.0003 to 0.002 inches at the crest of the pads. To assure solderability, the Tin should cover at least 95 percent of the surface of the sulfamate nickel. The Tin is very compatible with several types of solder. The Tin plating also makes a very robust process for manufacturing the bare printed circuit board. This is because the Tin is applied to the board immediately after the sulfamate nickel is plated and while the nickel is in the best, most pristine condition. This provides for excellent solderability, which is extremely important with surface mount applications.

Figure 4F:
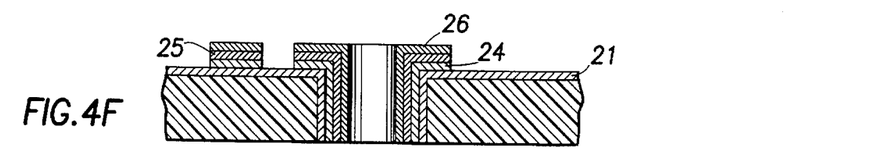

Following the Tin plating, the layer of plating resist 23 is chemically stripped from the board using a stripping solution which does not damage the plated traces of the conductive materials defining the underlying circuit as indicated by FIG. 4F. One stripping solution is an alkaline bath manufactured by Speedy Circuits of Huntington Beach, Calif. As previously stated, the composition of the solution will vary between manufactures.

Figure 4G:
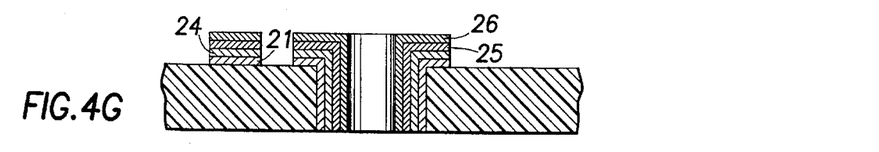

At stage FIG. 4G, all electroplated materials have been applied to the board and it is now time to remove the initial thin layer of copper 21 still remaining since its use as a conductive layer is no longer needed. To avoid removing the desired conductive traces, the etchant must be selected to have little reaction with the Tin but great reaction with copper.

Figure 4H:
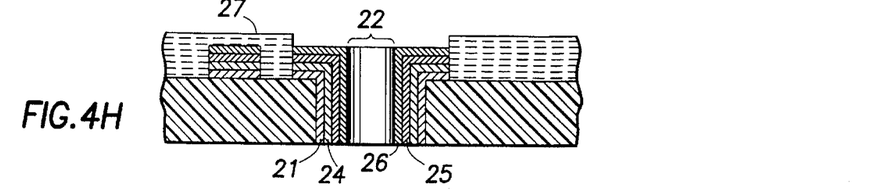

After the etching process and a thorough cleaning, a permanent solder mask 27 is applied using silk-screening as indicated in FIG. 4H. It is usually desirable to apply a mask in order to realize the highest possible wiring densities since the mask will prevent most solder "bridging" which would otherwise occur. A suitable material for the mask can be provided by a board manufacturer.

Figure 2B:
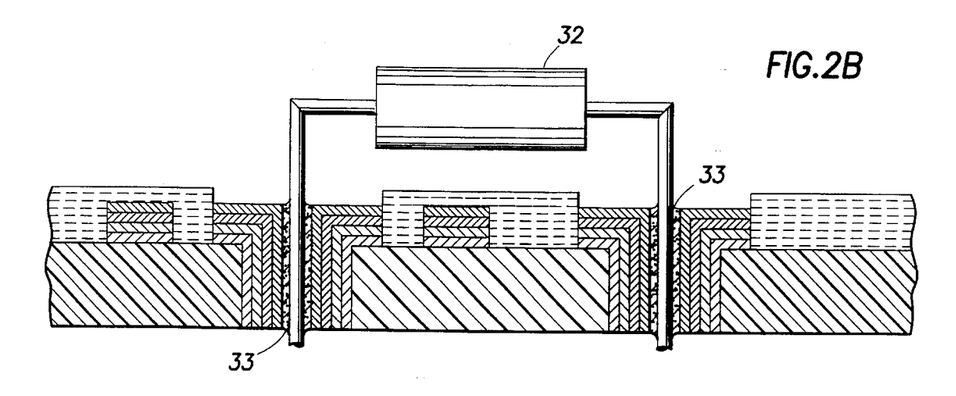
FIG. 2b shows the cross-sectional view of the printed circuit of the present invention.

Referring to FIG. 20, in a second method embodiment, electrical components 32 are attached to the board of the previous embodiment using a non-Lead component solder 33, such as SN 96. This solder is 96.5 percent Tin and 3.5 percent silver. This solder has lower reflow point than typical types of solder that are used in high temperature applications. Because of the lower reflow point, the circuit board and electrical components are exposed to lower soldering temperatures and therefore have less chances of damage from exposure to the soldering temperatures.

Figure 5:
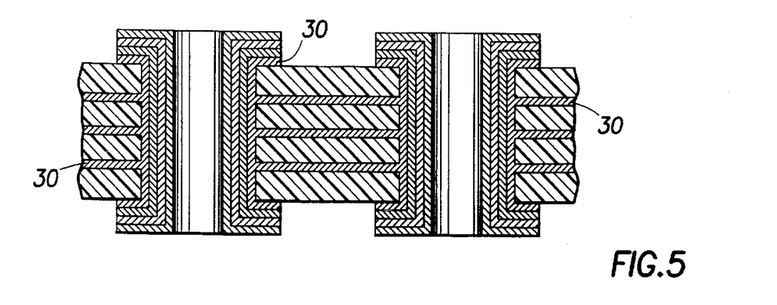
FIG. 5 is a cross-sectional view of a pads only multilayered printed wiring board.

Another embodiment of the invention is shown in FIG. 5. This embodiment is a multilayer printed wiring board. The multilayer printed wiring board comprises the features of a Lead free solder, a plating scheme on the printed wiring board runs and pads that Tin over sulfamate nickel and what is known as a "Pads Only" board design. In a "Pads Only" design, all runs are contained in the inner layers and only the pads are on the outer layers. These features act in concert with each other to provide a very robust system for high temperature active surface mount boards.

In this embodiment, several insulting lamina substrates 30 similar to those in other embodiments comprise the inner layers of this multilayer board. These substrates are made of a fiberglass-reinforced polyimide composite clad core material with 1 oz of copper foil on both sides and a prepregnated bonding material of glass-reinforced polyimide material and can vary in thickness depending on the circuit used and the application. The typical thickness is 0.62 mm. Each substrate is coated with an initial layer of copper. An etch resist can be applied to each board in the pattern of the desired circuit for that board. This step is performed with a photographic process that is known in the art. An etchant is applied to the substrates by dipping the substrates in an etch bath. This process removes all of the copper from the substrates in the areas not covered by the etch resist. Now each substrate contains copper only in the desired circuit pattern for that substrate. The substrates 30 are then stacked on top of each other in a predetermined arrangement. These substrates are placed between two copper-clad lamina substrates in a sandwich fashion. A curing process now occurs that bonds the two outer substrates to the inner substrates. The curing process applies heat and pressure to the substrates. The amount of heat and pressure will vary depending on the manufacturer. However, a minimum glass transition temperature should be 250° C. This minimum transition temperature is necessary because the temperature at which to process the board is approximately 250° C. The transition temperature has to be at least the same temperature as the board process temperature. However, the mechanical and physical characteristics of the board begin to change at the transition temperature. The remainder of the procedure is the preparation of the outer layers of the substrate and is the same as the procedure in FIG. 3.

The printed circuits of the present invention were tested by manufacturing a four-layer mixed technology board having active surface mount and through-hole components on the component side of the board and passive surface mount components on the solder side of the board. The active components included several sizes of Small Outline Integrated Circuits (SOIC) having gull-wing type leads (from 8 to 28 leads), four sizes of J-leaded Plastic Leaded Chip Carriers (PLCC20, 28, 44 & 68), a 20-lead plastic DRAM package, two plastic Transistors (SO 92 pkg), and three sizes of Ceramic Leadless Chip Carriers (LCC 20, 28 & 44). The throughhole and passive surface mount components used were standard downhole components.

Almost all of the active surface mount components used were plastic packages. Plastic is the most readily available package for surface mount components and is offered in the greatest variety of package types. Recent research indicates that plastic devices can perform reliably at extended temperatures.

To simulate a real board design, the test board included vias at every surface mount, internal run connections and a connector. The vias are required to bring connections to the component side of the board from the inner layers, and so to allow for electrical testing of all of the circuit nodes. To facilitate all of the vias are placed on 0.1-inch centers. Finally to determine if there would be a problem in having component side runs, two 10 Mil runs were added as shown on the right side of the board.

Several panels of this board were constructed for testing. The majority of the boards had the Tin plating reflowed in a hot oil process after it was applied over the Sulfamate Nickel. On two of the panels the Tin was not reflowed to see if this would make any difference in the board assembly or subsequent testing. It was noted that the board fabrication process was easier and more robust than conventional and current methods. This was because it was possible to do the Tin plating immediately following the Sulfamate Nickel plating, without any intervening steps. Thus the Sulfamate Nickel cannot become passivated and does not require any reactivation as in current processes.

Active surface mount components were soldered to twelve of the boards. This was done using an Infrared Reflow oven and SN 96 solder paste. The solder paste was applied with a 0.010-inch thick metal stencil. The printed circuit boards achieved a topside temperature of between 250°–260° C. during reflow.

Following the infra-red reflow, the through-hole and passive surface mount parts were assembled onto six of the boards, and these were wave soldered using our normal downhole wave solder process with HMP solder at 330° C. There was no reflow of any of the active surface mount components which were on the component side of the board. Although HMP solder was used on these boards, it is believed that it would be possible to use SN 96 solder in the wave soldering process as well. This would lower the soldering temperature, which may help protect the components and would result in an assembly which is totally Lead free.

Following assembly, four of the completed boards were temperature cycled. Since there were many different types and sizes of surface mount devices on the boards, this test was to determine which solder joints would remain functionally intact in an environment that simulated the actual field conditions. The boards were cycled at temperatures ranging from –25° C. to 185° C., with one-hour durations at each of the temperature extremes. This was to last for a total of 100 cycles. However, a problem was discovered after the first 20 cycles. This was a melting of the solder on the leads of all of the SOIC packages and many of the PLCC devices. In addition, the solder on the pads connected to these leads also reflowed. On these devices several of the solder connections were now open and were no longer connected. The source of this problem turned out to be that these components had leads that were dipped in SN 63 solder, which is a low melting point solder that contains Lead. There was enough Lead that it contaminated the SN 96 that had been used in the reflow process and bought the initial melting temperature of the joints on those parts below 185° C. Three of the PLCC packages on each board did not fail even though they also had SN 63 solder on their leads. In this case, however, they were plated instead of being dipped and had much smaller volume of the SN 63 solder on them, resulting in an initial melting point above 183° C. These parts, including the large 68-lead PLCC, survived the full 100 heat cycles without failure. So it was determined that the solder joints would survive if they did not become critically Lead contaminated.

In this first test, there were some failures with the ceramic leadless ship carriers, which are gold plated. When examining the boards after 37 heat cycles, there were several catastrophic failures noted on those devices. At this point all of the surface mount devices were tinned with SN 96 solder and new boards were assembled for continued testing. This would eliminate the Lead contamination problem from the plastic devices as well remove the gold from the ceramic components.

A melting point test on one of the SOIC leads revealed an initial melting temperature of 182° C. indicating the presence of Lead, which was confirmed with the Scanning Electron Miscroscope (SEM). This indicated that a more controlled process would be necessary to insure that all of the Lead is removed by the SN 96 dip procedure. It was noted that the solder joints on the ceramic LCC parts looked grainy and had indications of small micro-cracks although none of the joints had failed. This showed that all of the gold was not being removed by the dip procedure as well. The temperature cycling was continued to 100 cycles on three of these boards with the result that the good joints stayed good and the bad joints became slightly worse.

At this point, several sets of parts were redipped in SN 96 with controlled dwell time and temperature parameters. Some of the PLCC and SOIC parts showed reduced solderability. Using these parts, two more boards wee assembled and temperature cycled. With these boards a full 100 heat cycles were completed with no visible indications of failure or stress on any of the solder joints.

Following the 100 heat cycles, these last two boards were taken down in temperature and held at −55° C. for a period of seven hours. There were no discernible effects on any of the plastic devices or their solder joints. The solder joints of the ceramic LCC devices however did show signs of stress after these test, although there were no failures. The larger devices were more affected than the smaller devices.

A full series of vibration tests we run on one to the boards from the second group after it had received 26 full cycles. There were no problems with the exception that one joint had nearly failed as a result of the temperature cycles became worse with the vibration as would be expected. The vibration test was repeated after 100 heat cycles with the same result, good joints stayed good and bad joints became worse.

These tests demonstrated that the printed circuits with the new Tin solder compounds and the new plating scheme were able to operate at temperatures above 200° C. without circuit failure.

It is appreciated by those skilled in the art that other materials may be substituted for those used in the examples in the description herein. In addition, the materials and solutions used to manufacture a printed circuit and printed wiring board according to the methods described herein are known or will be obvious to those skilled in the art based on the requirements listed herein.

What is claimed is:

1. A printed circuit containing a combination of a solder and connective conductor components that enable said circuit to maintain its mechanical properties comprising:

a) a non-conductive substrate having a top surface and a bottom surface;

b) a lead-free connective conductor component plated to at least one surface of said substrate in a desired circuit pattern, said conductor component having a layer of a first conductive material covering said substrate in the desired circuit pattern, a lead-free ductile second conductive material covering said first conductive material, said material being inert to chemical attacks and a third conductive material covering said second conductive material, said third material being compatible with solder used to solder electronic components to said substrate;

c) electronic components to be attached to said substrate in a manner such that said electronic components are connected to each other via said connective conductor to create a desired electrical circuit; and d) a solder for attaching said electronic components to the substrate, said solder material having a lead-free composition and being compatible with said connective conductor material and said solder material having a eutectic temperature such that electronic components are not damaged from exposure to temperatures of approximately said eutectic temperature.

2. The printed circuit of claim 1 wherein said connective conductor component comprises a copper material plated material plated to the substrate, a sulfamate nickel material plated on to the copper and a tin material plated over the sulfamate nickel.

3. The printed circuit of claim 1 said solder material comprises a combination of tin and silver.

4. The printed circuit of claim 3 wherein said connective conductor is capable of withstanding temperatures up to ten degrees centigrade of the eutectic temperature of said solder.

5. The printed circuit of claim 1 wherein said plurality of conductive materials are selected such that impurities are minimized when said materials are exposed to temperatures up to ten degrees centigrade of the eutectic temperature of said solder.

6. The printed circuit of claim 5 wherein a said first conductive material is copper.

7. The printed circuit of claim 5 wherein second conductive material is a lead-free conductive material selected from a group of conductive materials comprising sulfamate nickel, iron and platinum.

8. The printed circuit of claim 5 wherein said third conductive material is tin.

9. The printed circuit of claim 5 wherein said solder material is a combination of tin and silver.

10. The printed circuit of claim 1 wherein each surface of said substrate includes a connective conductor.

11. The printed circuit of claim 1 wherein said second conductive material is selected from a group of conductive materials comprising sulfamate nickel, iron and platinum.

12. The printed circuit of claim 1 wherein said third conductive material is a layer of tin material.

13. A printed wiring board containing lead-free conductive materials, affixed to a non-conductive substrate, that enable a printed circuit to maintain its mechanical properties and to operate reliably when said circuit is exposed to environments having a temperature range from ambient up to ten degrees centigrade of the eutectic temperature of a lead-free solder that attaches electrical components to said board comprising:

a) a layer of a first conductive material covering said substrate in a desired circuit pattern;

b) a layer of a second conductive and chemically resistant material covering said first conductive material, said second material being ductile material capable of maintaining its structure over said temperature range;

c) a layer of a third conductive material covering said second conductive material, said third material being compatible with solder used to solder electrical components to said substrate; and d) a lead-free solder mask covering said substrate except in areas where it will be applied.

14. The printed wiring board of claim 13 wherein said second conductive material is selected from a group of materials comprising nickel, iron and platinum.

15. The printed wiring board of claim 13 wherein said first conductive material is copper and said third conductive material is tin.

16. The printed board of claim 14 wherein said substrate is comprised of a polyimide laminate material.

17. The printed wiring board of claim 14 wherein said substrate contains holes drilled in a desired circuit pattern.

18. The printed wiring board of claim 14 wherein said solder material includes a tin and silver alloy.

19. The printed wiring board of claim 18 wherein both sides of the board are covered by said conductive layers.

20. A printed circuit comprising conductive areas affixed to an insulating substrate and electronic components electrically connected by solder to said conductive areas comprising:
   a) a lead-free first conductive material;
   b) a lead-free solder, said solder material having a eutectic temperature such that electronic components are not damaged from exposure to temperatures within approximately ten degrees centigrade of said eutectic temperature;
   c) a lead-free ductile transition conductive material covering said first conductive material, said transition material being able to maintain its structure over a temperature range from ambient up to ten degrees centigrade of the eutectic temperature of the solder, the material also being highly solderable and inert to chemical attacks; and
   d) a lead-free second conductive material covering said transition conductive material, said second conductive material being capable of preserving solderability of said transition material and being compatible with said solder.

21. The printed circuit of claim 20 wherein said transition conductive material is selected from group of materials comprising nickel, iron and platinum.

22. The printed circuit of claim 20 wherein said solder includes a tin and silver alloy.

23. The printed circuit of claim 20 wherein said second conductive is tin and said first conductive material is copper.

24. The printed circuit of claim 1 wherein said circuit is capable of reliably operating when said circuit is exposed to environments having temperatures up to approximately two hundred ten degrees centigrade.

25. A printed circuit containing a combination of a solder and connective conductor components that enable said circuit to maintain its mechanical properties comprising:
   a) a non-conductive substrate having a top surface and a bottom surface;
   b) a lead-free connective conductor component plated to at least one surface of said substrate in a desired circuit pattern, said conductor component having a layer of a first conductive material covering said substrate in the desired circuit pattern, and a second conductive material covering said first conductive material, said second material being compatible with solder used to solder electronic components to said substrate;
   c) electronic components to be attached to said substrate in a manner such that said electronic components are connected to each other via said connective conductor to create a desired electrical circuit; and
   d) a solder for attaching said electronic components to the substrate, said solder material having a lead-free composition and being compatible with said connective conductor material and said solder material having a eutectic temperature such that electronic components are not damaged from exposure to temperatures of approximately said eutectic temperature.

* * * * *